(12) United States Patent
Imamura et al.

(10) Patent No.: US 8,975,535 B2
(45) Date of Patent: Mar. 10, 2015

(54) MANY-UP WIRING SUBSTRATE, WIRING SUBSTRATE, AND ELECTRONIC DEVICE

(75) Inventors: Kazuhito Imamura, Satsumasendai (JP); Yousuke Moriyama, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 13/393,447

(22) PCT Filed: Dec. 24, 2010

(86) PCT No.: PCT/JP2010/073403
§ 371 (c)(1),
(2), (4) Date: May 18, 2012

(87) PCT Pub. No.: WO2011/078349
PCT Pub. Date: Jun. 30, 2011

(65) Prior Publication Data
US 2012/0222895 A1    Sep. 6, 2012

(30) Foreign Application Priority Data

Dec. 24, 2009 (JP) ................................. 2009-292013
Dec. 20, 2010 (JP) ................................. 2010-283289

(51) Int. Cl.
*H05K 1/18*    (2006.01)
*H05K 1/02*    (2006.01)
(Continued)

(52) U.S. Cl.
CPC ............ *H05K 3/0052* (2013.01); *H01L 21/481* (2013.01); *H05K 1/0269* (2013.01);
(Continued)

(58) Field of Classification Search
CPC . H05K 3/0052; H05K 3/0044; H05K 1/0306; H05K 2203/0228; H05K 2201/09036; H05K 2201/0909; H01L 24/96
USPC ........................... 174/250, 260, 255; 361/760
See application file for complete search history.

(56) References Cited

U.S. PATENT DOCUMENTS 7,001,569 B2 * 2/2006 Saitoh et al. ................... 264/672
7,232,957 B2 * 6/2007 Mizutani et al. .............. 174/260
(Continued)

FOREIGN PATENT DOCUMENTS

CN    101471316 A    7/2009
CN    101488486 A    7/2009
(Continued)

OTHER PUBLICATIONS

European Search Report dated Apr. 9, 2013, issued in counterpart European Application No. 10839578.1.
(Continued)

*Primary Examiner* — Hoa C Nguyen
*Assistant Examiner* — Amol Patel
(74) *Attorney, Agent, or Firm* — Procopio, Cory, Hargreaves & Savitch LLP

(57) ABSTRACT

In a many-up wiring substrate including a base substrate having dividing grooves formed as part of main surfaces thereof, along boundaries of a plurality of wiring substrate regions, the plurality of wiring substrate regions being arranged in a matrix, when seen in a transparent plan view, dividing grooves of the main surface and dividing grooves of an opposite main surface are formed to be deviated in one direction of transverse direction or longitudinal direction, and a distance between bottoms of the dividing grooves of one main surface and bottoms of the dividing grooves of the opposite main surface is smaller than a distance between the bottoms of the dividing grooves of the one main surface and the opposite main surface and a distance between the bottoms of the dividing grooves of the opposite main surface and the one main surface.

7 Claims, 7 Drawing Sheets

(51) Int. Cl.
*H05K 3/00* (2006.01)
*H01L 21/48* (2006.01)
*H01L 23/13* (2006.01)
*H01L 23/498* (2006.01)
*H01L 23/00* (2006.01)
*H05K 1/03* (2006.01)

(52) U.S. Cl.
CPC ...... *H05K1/0306* (2013.01); *H05K 2201/0909* (2013.01); *H05K 2201/09154* (2013.01); *H05K 2201/09918* (2013.01); *H05K 2203/1572* (2013.01); *H05K 3/0008* (2013.01); *H01L 23/13* (2013.01); *H01L 23/49827* (2013.01); *H01L 24/96* (2013.01)
USPC ............................ 174/260; 174/255; 361/760

(56) References Cited

U.S. PATENT DOCUMENTS

| 7,250,352 B2 * | 7/2007 | Mizutani et al. ............... 438/460 |
| 7,253,027 B2 * | 8/2007 | Kanakubo ..................... 438/113 |
| 2009/0166895 A1 | 7/2009 | Noguchi et al. |

FOREIGN PATENT DOCUMENTS

| JP | 54-97766 U | | 7/1979 |
| JP | H11-177139 A | | 7/1999 |
| JP | 11346038 A | * | 12/1999 |
| JP | H11-346038 A | | 12/1999 |
| JP | 2004-200615 A | | 7/2004 |
| JP | 2005-057031 A | | 3/2005 |
| JP | 2005057031 A | * | 3/2005 |
| JP | 2005-136129 A | | 5/2005 |
| JP | 2005136129 A | * | 5/2005 |
| JP | 2006-128363 A | | 5/2006 |
| JP | 2008-028065 A | | 2/2008 |
| JP | 2009-158687 A | | 7/2009 |

OTHER PUBLICATIONS

International Search Report dated Feb. 1, 2011, issued for International Application No. PCT/JP2010/073403.
Decision of Refusal dated Aug. 20, 2013 for corresponding JP Patent Application No. 2011-547660, in 2 pages.
Office Action dated Jan. 24, 2014, issued in counterpart Chinese application No. 201080038696.7.
Office Action dated Dec. 24, 2014 issued for counterpart Japanese patent application No. 2011-547660.
Office Action dated Sep. 16, 2014 issued for counterpart Japanese application No. 2011-547660.

* cited by examiner (a)

(b)

(c)

(a)

(b)

(a)

(b)

(a)

(b)

(a)

(b)

MANY-UP WIRING SUBSTRATE, WIRING SUBSTRATE, AND ELECTRONIC DEVICE

TECHNICAL FIELD

The present invention relates to a many-up wiring substrate which has a plurality of wiring substrate regions arranged in a matrix to be wiring substrates for mounting electronic components, respectively, at a center portion of a base substrate, and dividing grooves at boundaries of the wiring substrate regions, a wiring substrate, and an electronic device in which electronic components are mounted on the wiring substrate.

BACKGROUND ART

Conventional wiring boards for mounting electronic components such as semiconductor devices and crystal oscillators are formed by, for example, disposing a wiring conductor including a metallized conductor containing a metal powder such as tungsten or molybdenum on a surface of an insulating base body made of an electrically insulating material such as a sintered aluminum oxide.

The wiring substrate generally has electronic component-mounting regions each provided with a wiring conductor led on a surface of the wiring substrate to be connected with an electronic component. An electronic device is manufactured by mounting electronic components in the electronic component-mounting regions on the wiring substrate and electrically connecting electrodes of the electronic components to corresponding wiring conductors, respectively, using soldering or electric connecting means such as a bonding wire. Further, the electronic components of the electronic device are sealed, if necessary, by bonding a cover or lens barrel, which is made of metal, ceramics, glass, or resin, to cover the electronic components (see Patent Literature 1).

The electronic components, for example, are mounted in the electronic component-mounting regions with respect to two sides of a rectangular wiring substrate after pressing the two sides of the four sides of the wiring substrate with an alignment jig. Further, bonding and mounting a cover or lens barrel of the electronic device or mounting the electronic device on an external electric circuit board is also performed with respect to two sides of the wiring substrate.

Further, the wiring substrate has been decreased in size with the demand for reducing the size of the electronic device in recent years. Dividing a many-up wiring substrate is usually performed to efficiently manufacture a plurality of wiring substrates. On the many-up wiring substrate, a plurality of wiring substrate regions are arranged in a matrix at a center portion of a wide-area base substrate and dividing grooves which separate the wiring substrate regions are formed in a matrix. A plurality of wiring substrates can be achieved by bending and dividing the base substrate along the dividing grooves.

CITATION LIST

Patent Literature

Patent Literature 1: Japanese Unexamined Patent Publication JP-A 2004-200615

SUMMARY OF INVENTION

Technical Problem

However, the many-up substrate has a problem in that when the base substrate is bent and divided along the dividing grooves, burrs can be formed on the sides of the wiring substrate after dividing. As described above, when burrs are formed on the sides of the wiring substrate and alignment is performed with respect to the sides having the burrs, such a problem arises that it is difficult to achieve precise mounting, in mounting electronic components on the wiring substrate with respect to the sides of the wiring substrate, bonding and mounting a cover or lens barrel with respect to the sides of an electronic device with electronic components on the wiring substrate, or mounting an electronic device on an external electric circuit board with respect to the sides of the electronic device with electronic components on the wiring substrate. In particular, in the case of mounting an imaging element as an electronic component, demand of precisely forming the sides of the wiring substrate that are references for alignment is increasing, as an imaging device is reduced in size and improved in function.

The invention has been made in consideration of the problems in the related art, and it is an object to provide a many-up wiring substrate that makes it possible to manufacture a wiring substrate where electronic components can be precisely mounted in electronic component-mounting regions on the wiring substrate. Further, it is another object to provide a wiring substrate where electronic components can be precisely mounted, and an electronic device where a cover or lens barrel is precisely bonded and that can be mounted on an external electric circuit board.

Solution to Problem

The invention provides a many-up wiring substrate including a base substrate having dividing grooves formed as part of main surfaces thereof, along boundaries of a plurality of wiring substrate regions, the plurality of wiring substrate regions being arranged in a matrix and each having an electronic component-mounting region at a center thereof, when seen in a transparent plan view, dividing grooves of one main surface and dividing grooves of an opposite main surface being formed to be deviated in one direction of a transverse direction or longitudinal direction, and a distance between bottoms of the dividing grooves of one main surface and bottoms of the dividing grooves of the opposite main surface being smaller than a distance between the bottoms of the dividing grooves of the one main surface and the opposite main surface and a distance between the bottoms of the dividing grooves of the opposite main surface and the one main surface.

Further, in a configuration of the many-up wiring substrate of the invention, an aligning mark may be disposed at one corner of each of the wiring substrate regions.

Further, the invention provides a wiring substrate having a rectangular shape when seen in a plan view, including two adjacent sides having broken-out sections inclining with respect to a direction perpendicular to a main surface of the wiring substrate.

Further, the invention provides an electronic device including the wiring substrate having the configuration, and an electronic component mounted on the wiring substrate.

Advantageous Effects of Invention

According to the many-up wiring substrate of the invention, when seen in a transparent plan view, the dividing grooves of one main surface and the dividing grooves of the opposite main surface are formed to be deviated in the longitudinal direction or the transverse direction, the distance between the bottoms of the dividing grooves of one main surface and the bottoms of the dividing grooves of the opposite main surface is smaller than the distance between the bottoms of the dividing grooves of one main surface and the opposite main surface and the distance between the bottoms of the dividing grooves of the opposite main surface and one main surface, such that when the base substrate is bent and divided along the dividing groove, the portions between the bottoms of the dividing grooves of one main surface and the bottoms of the dividing grooves of the opposite main surface of the base substrate are divided, and the broken-out sections between bottoms of the dividing grooves of one main surface and the bottoms of the dividing grooves of the opposite main surface are inclined at the sides of the wiring substrates. The broken-out sections are formed at four sides, in which two broken-out sections face one main surface and the other two broken-out sections face the opposite main surface. Accordingly, for example, when one main surface is a mounting surface of the wiring substrate, even if a burr is formed on the broken-out section facing the opposite main surface, it is possible to reduce protrusion of the burr to the outside further than the portion that is the bottom of the dividing groove of one main surface, such that the portion that is the bottom of the dividing groove of one main surface becomes a reference for positioning the wiring substrate. By setting this portion as reference, it is possible to precisely mount an electronic component in the electronic component-mounting region. Further, when the opposite main surface is a mounting surface of the wiring substrate, even if a burr is formed on the broken-out section facing the opposite main surface, it is possible to reduce protrusion of the burr to the outside further than the portion that is the bottom of the dividing groove of opposite main surface, such that the portion that is the bottom of the dividing groove of opposite main surface becomes a reference for positioning the wiring substrate.

Further, in the many-up wiring substrate having the configuration of the invention, when an aligning mark is provided at one corner of each of the wiring substrate regions, it becomes easy to determine the side that is the reference of the wiring substrate when seen in a plan view, by determining the positional relationship between the position of the aligning mark and the side that is the reference of the wiring substrate when seen in a plan view, it is efficient to mount an electronic component in the electronic component-mounting region effectively.

According to the wiring substrate of the invention, since the wiring substrate having a rectangular shape includes has the two adjacent sides having the broken-out sections inclining with respect to the direction perpendicular to the main surface of the wiring substrate, even if a burr is formed on the broken-out section, it is possible to reduce protrusion of the burr outward further than an outer edge of the wiring substrate in a plan view, such that it is possible to mount an electronic component precisely on the wiring substrate, with the outer edge of the wiring substrate as the reference for alignment of the electronic component.

According to the electronic device of the invention, since an electronic component is mounted in the electronic component-mounting region of the wiring substrate having the configuration describe above, an electronic device with an electronic component precisely mounted in the electronic component-mounting region and two outer edges of the electronic device can be recognized well by an image recognizing device or the like, such that it is possible to precisely bond a cover or lens barrel to the electronic device with the outer edges of two sides of the electronic device as a reference, or mount the electronic device on an external electric circuit board.

DESCRIPTION OF EMBODIMENTS

Figure 1:
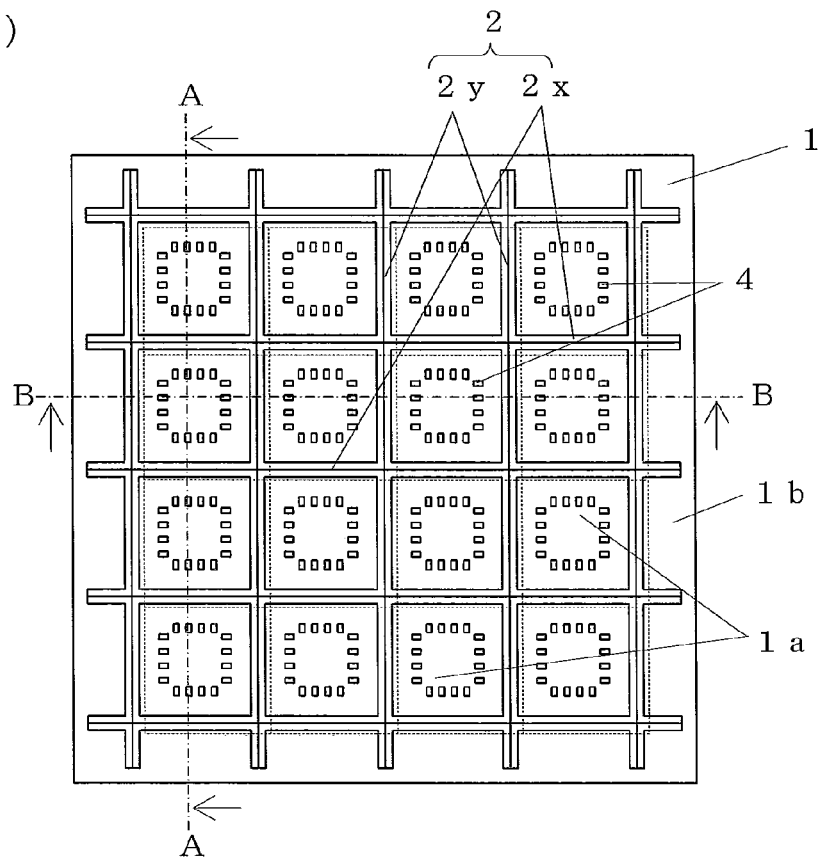
FIG. 1(a) is a plan view showing an example of an embodiment of a many-up wiring substrate of the invention.
FIG. 1(b) is a cross-sectional view showing a cross-section taken along the line A-A.
FIG. 1(c) is a cross-sectional view showing a cross-section taken along the line B-B of FIG. 1(a)
Figure 1:
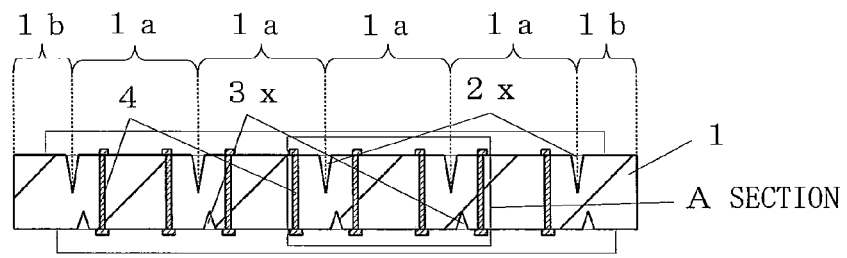
Figure 1:
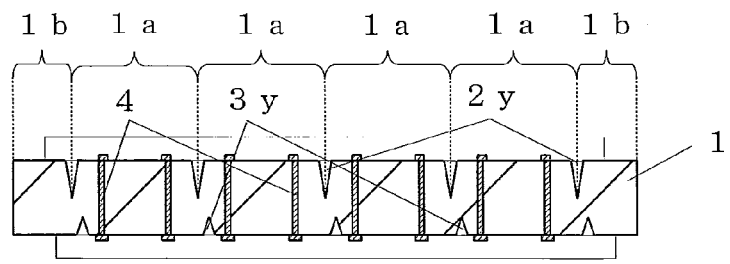
Figure 2:
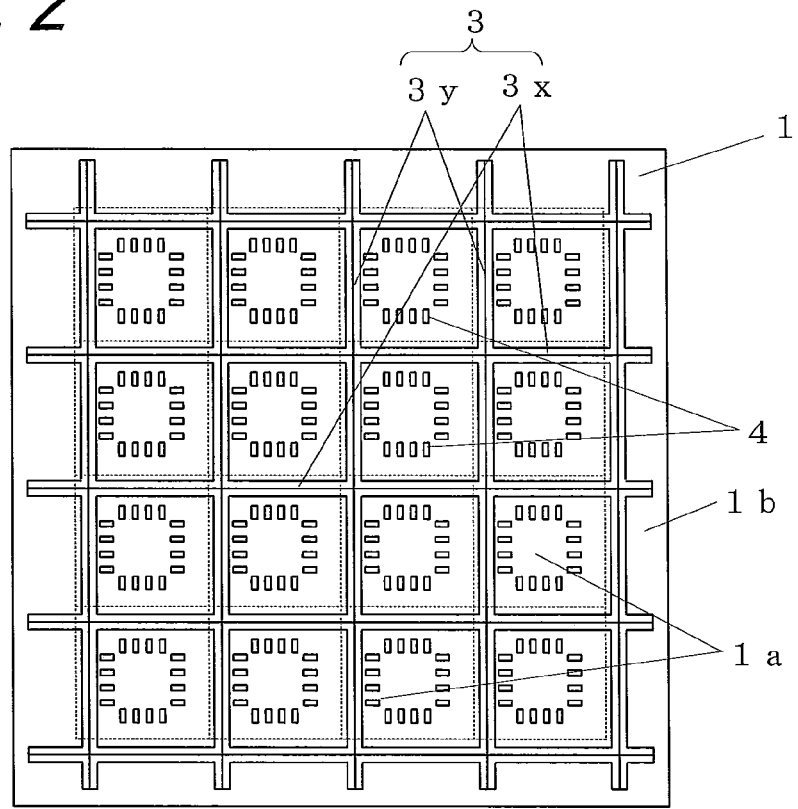
FIG. 2 is a bottom view showing an example of the embodiment of the many-up wiring substrate of FIG. 1(a)

A many-up wiring substrate and a wiring substrate of the invention are described with reference to the accompanying drawings. In FIGS. 1 to 8, reference numeral 1 indicates a base substrate, reference numeral 1a indicates a wiring substrate region, reference numeral 1b indicates a dummy region, reference numeral 1c indicates a notch portion, reference numeral 1d indicates a broken-out section, reference numeral 1e indicates a wiring substrate, reference numeral 2(2x, 2y) indicates a dividing groove of one main surface, reference numeral 3(3x, 3y) indicates a dividing groove of the opposite main surface, reference numeral 4 indicates a wiring conductor, reference numeral 5 indicates an aligning mark, reference numeral 6 indicates a recess, and reference numeral 7 indicates a dummy recess. Further, the position of the bottom of the dividing groove 3 of an opposite main surface, the position of the bottom of the dividing groove 2 of one main surface, and an outer edge of the opposite main surface of the wiring substrate 1e are shown by broken lines, in FIGS. 1(a), 3(a), and 4(a), in FIG. 2, and in FIG. 7(a), respectively.

In the many-up wiring substrate of the example shown in FIGS. 1 to 5, a plurality of wiring substrate regions 1a are arranged in a matrix at the center portion of the base substrate 1 and the dummy regions 1b are disposed around the wiring substrate regions 1a (outside the base substrate 1). In the many-up wiring substrate with the wiring substrate regions 1a at the center portion, it is possible to favorably manufacture a plurality of small wiring substrates 1e of the example shown in FIG. 6 by dividing each of the wiring substrate regions 1a. Further, in the example shown in FIG. 1(a), FIG. 2, and FIG. 4(a), total 16 wiring substrate regions 1a are arranged in four rows and columns in a matrix on the base substrate 1. Dividing grooves 2 of one main surface composed of a transverse dividing groove 2x and a longitudinal groove 2y are formed at the boundaries of the wiring substrate regions 1a on the main surface of the base substrate 1 and dividing grooves 3 of an opposite main surface composed of a transverse dividing groove 3x and a longitudinal dividing groove 3y are formed at the boundary of the wiring substrate regions 1a of the opposite main surface of the base substrate 1. Further, similar to the boundary of the wiring substrate regions 1a with each other, the dividing grooves 2 of one main surface and the dividing groove 3 of the opposite main surface are formed at the boundary of the wiring substrate regions 1a and the dummy regions 1b.

The many-up wiring substrate of the invention, as shown in FIGS. 1 to 5, is a many-up wiring substrate including a base substrate 1, the base substrate 1 having dividing grooves formed as part of main surfaces thereof, along boundaries of a plurality of wiring substrate regions 1a, the plurality of wiring substrate regions 1a being arranged in a matrix and each having an electronic component-mounting regions at a center thereof, when seen in a transparent plan view, dividing grooves 2 of one main surface and dividing grooves 3 of an opposite main surface are formed to be deviated in one direction of a transverse direction or longitudinal direction and a distance L1 between bottoms of the dividing grooves 2 of one main surface, and bottoms of the dividing grooves 3 of the opposite main surface is smaller than a distance L2 between the bottoms of the dividing grooves 2 of the one main surface and the opposite main surface and a distance L3 between the bottoms of the dividing grooves 3 of the opposite main surface and the one main surface.

According to the many-up wiring substrate of the invention, when the base substrate 1 is bent and divided along the dividing grooves, the base substrate 1 is divided at positions between the bottoms of the dividing grooves 2 of one main surface and the bottoms of the dividing grooves 3 of the opposite main surface, such that the sides of the wiring substrates 1e, that is, the broken-out sections 1d between the bottoms of the dividing grooves 2 of one main surface and the bottoms of the dividing grooves 3 of the opposite main surface become inclined surfaces. The broken-out sections 1d are formed at four sides of each of the wiring substrate 1e, in which two broken-out surfaces 1d face one main surface and the other two broken-out sections 1d face the opposite main surface. Accordingly, for example, when one main surface is a mounting surface of the wiring substrate 1e, even if a burr is formed on the broken-out section 1d facing the opposite main surface, it is possible to reduce protrusion of the burr to the outside further than the portion that is the bottom of the dividing groove 2 of one main surface, such that the portion that is the bottom of the dividing groove 2 of one main surface becomes a reference for aligning the wiring substrate 1e. By setting this portion as a reference, it is possible to precisely mount an electronic component (not shown) in the electronic component-mounting region. Further, when the opposite main surface is a mounting surface of the wiring substrate 1e, even if a burr is formed on the broken-out section 1d facing the opposite main surface, it is possible to reduce protrusion of the burr to the outside further than the portion that is the bottom of the dividing groove 3 of the opposite main surface, such that the portion that is the bottom of the dividing groove 3 of the opposite main surface becomes a reference for aligning the wiring substrate 1e.

Figure 4:
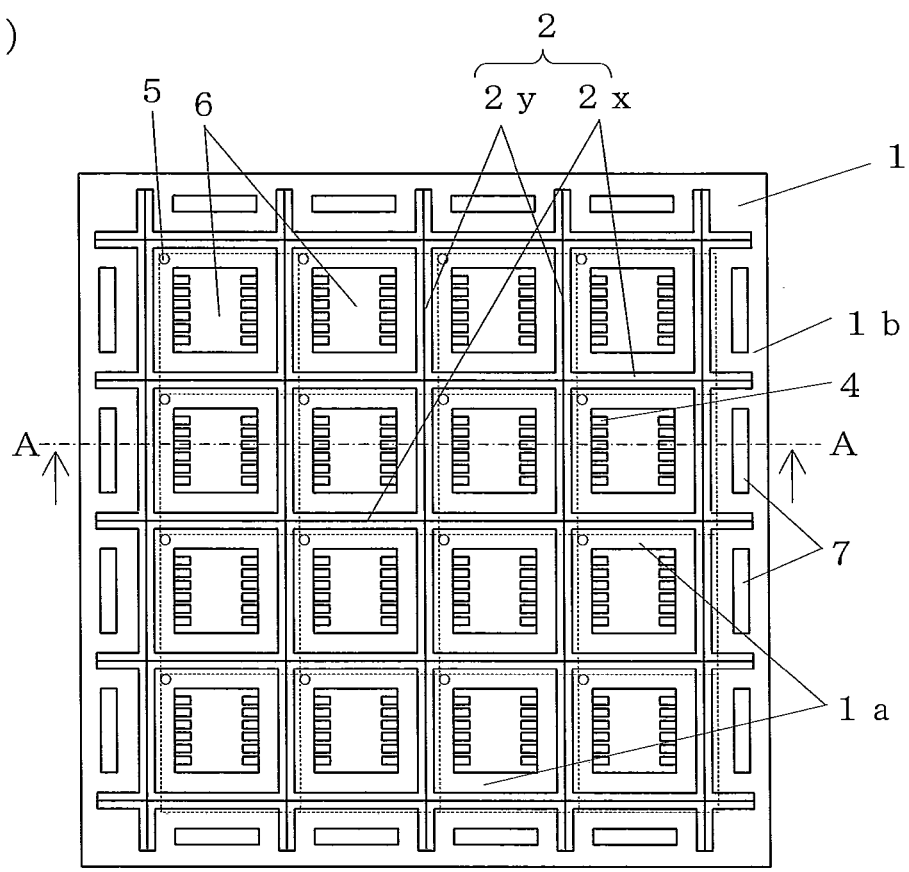
FIG. 4(a) is a plan view showing another example of an embodiment of a many-up wiring substrate of the invention.
FIG. 4(b) is a cross-sectional view showing the cross-section taken along the line A-A of FIG. 4(a)
Figure 4:
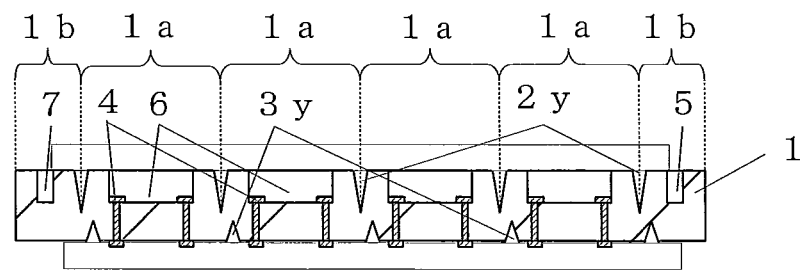

Further, as in the example shown in FIG. 4, when an aligning mark 5 is disposed at one corner of each of the wiring substrate regions 1a, it becomes easy to determine the side that is the reference of the wiring substrate 1e when seen in a plan view, by determining the positional relationship between the position of the aligning mark 5 and the side that is the reference of the wiring substrate 1e when seen in a plan view, it is efficient to mount an electronic component in the electronic component-mounting region.

The base substrate 1 is formed of a single insulating layer made of a ceramic material, such as a sintered aluminum oxide, a sintered mullite, sintered aluminum nitride, a sintered silicon carbide, a sintered silicon nitride, and glass ceramics, or formed by laminating a plurality of insulating layers made of the ceramic material. The wiring substrate regions 1a (surrounded by broken lines) shown in FIGS. 1 to 5, where the wiring conductors 4 formed by metallization of metal powder, such as tungsten, molybdenum, copper, and silver, are arranged in a matrix at the center portion of the base substrate 1. Each of the regions surrounded by the broken lines of the base substrate 1 corresponds to the wiring substrate region 1a, which is the wiring substrate 1e.

For example, when the insulating layer is made of an a sintered aluminum oxide, the base substrate 1 is manufactured from a single insulating layer or a plurality of insulating layers by obtaining a ceramic green sheet by forming a ceramic slurry, which is obtained by adding and mixing an appropriate organic binder, a solvent, a plasticizer, a dispersant, or the like to a ceramic raw powder, such as an aluminum oxide, a silicon oxide, a magnesium oxide, a calcium oxide, or the like, in a sheet shape by using a sheet forming method, such as a doctor blade method known in the art, and then subjecting an appropriate punching process to the ceramic green sheet and laminating a plurality of the sheets, if necessary, to manufacture a green body that becomes the base substrate 1, and firing the green body at a temperature of about 1500 to 1800° C.

Further, the base substrate 1 further has the dummy regions 1b at the periphery of the center portion where the plurality of wiring substrate regions 1a are arranged in a matrix. The dummy regions 1b are regions that make it easy to manufacture or carry the many-up wiring substrate and positioning or fixing can be performed by the dummy regions 1b when the green body or the many-up wiring substrate that becomes the base substrate 1 is machined or carried. It is preferable to position both ends of the dividing groove 2 in the dummy region 1b between the wiring substrate region 1a at the outermost side and the peripheral portion of the green body that becomes the base substrate 1, because it is possible to prevent the base substrate 1 from being unnecessarily divided by a force applied from the outside when the base substrate 1 is carried. Further, when the dummy regions 1b are formed, the dividing grooves 2 of one main surface and the dividing grooves 3 of the opposite main surface are also formed at the boundaries of the wiring substrate regions 1a and the dummy regions 1b.

The wiring conductor 4 has wiring conductor layers disposed on the surface of the insulating layer or between the insulating layers, and a through-conductor that passes through the insulating layers and electrically connects the wiring conductor layers positioned above and below the insulating layers. The wiring conductor layer is formed by printing and applying a metallization paste for a wiring conductor layer to the ceramic green sheet for the base substrate 1 by using printing technique, such as a screen printing method, and firing the metallization paste with the green body of the base substrate 1. The through-conductor is formed by forming a through hole for a through-conductor by process such as punching process with a mold or a punch or laser process, on the ceramic green sheet for the base substrate 1 before printing and applying the metallization paste for forming the wiring conductor 4, filling the through-hole with a metallization paste for a through-conductor by printing technique, such as a screen printing method, and firing the metallization paste with the green body that becomes the base substrate 1. The metallization paste is made by adding an organic binder, an organic solvent, and if necessary, a dispersant to metal powder, which is the main component, and mixing and kneading the metal powder with kneading means such as a ball mill, a triple roll mill, or a planetary mixer. Further, glass or ceramic powder may be added to fit the sintering behavior of the ceramic green sheet or to increase the bonding strength with the fired base substrate 1. The metallization paste for a through-conductor is adjusted to have viscosity higher than a general metallization paste for a through-conductor to be suitable for filling, by the kinds of the addition amount of the organic binder or the organic solvent.

Further, metal with high corrosion resistance, such as nickel and gold metal, is applied to the exposed surface of the wiring conductor 4, if necessary. Accordingly, it is possible to effectively suppress the wiring conductor 4 from corroding and to strengthen bonding of the wiring conductor 4 and an electric component, the wiring conductor 4 and a bonding wire, and the wiring conductor 4 and a wiring conductor of an external electric circuit board. Further, for example, a nickel-plating layer with a thickness of about 1 to 10 μm and a gold-plating layer with a width of about 0.1 to 3 μm are sequentially applied to the exposed surface of the wiring conductor 4 by electrodeposition or electroless deposition.

The dividing groove 2 of one main surface and the dividing groove 3 of the opposite main surface are formed at the boundary of the wiring substrate regions 1a of both main surfaces of the base substrate 1 and the boundary of the wiring substrate region 1a and the dummy region 1b. The dividing groove 2 of one main surface and the dividing groove 3 of the opposite main surface may be formed by pressing a cutter blade or a mold against the green body that becomes the base substrate 1, or performing laser process or dicing process on the green body that becomes the base substrate 1 or the fired base substrate 1. Meanwhile, the longitudinal cross-sectional shape of the dividing groove 2 of one main surface may be a V-shape, a U-shape, or a recessed shape, but, as shown in FIGS. 1 to 5, it is preferable to make the cross-section in a V-shape, because stress easily concentrates on the bottom of the dividing groove 2 when the base substrate 1 is bent and cut along the dividing groove, such that it is possible to precisely divide the base substrate 1 with a smaller force than the U-shape or the recessed shape.

The depths of the dividing groove 2 of one main surface and the dividing groove 3 of the opposite main surface are appropriately set, for example, by the material of the insulating base and it is preferable that the sum of the depths is 50 to 70% of the thickness of the base substrate 1. When the sum of the depths of the dividing groove 2 of one main surface and the dividing groove 3 of the opposite main surface is less than 50% of the thickness of the base substrate 1, the mechanical strength may be too high with respect to the thickness of the base substrate 1, and when the sum of the depths of the dividing groove 2 of one main surface and the dividing groove 3 of the opposite main surface excesses 70%, the mechanical strength of the base substrate 1 with respect to the thickness of the base substrate 1. As the sum of the depths of the dividing groove 2 of one main surface and the dividing groove 3 of the opposite main surface is set as described above, a many-up wiring substrate in which the base substrate 1 is to be divided well without unnecessary dividing is achieved.

When the opening widths of the depths of the dividing groove 2 of one main surface of the base substrate 1 and the dividing groove 3 of the opposite main surface are about 0.01 to 1.0 mm, the base substrate 1 can be divided well, which is preferable because the wiring substrate regions 1a are not reduced by the influence of the areas of the dividing grooves 2, such that the wiring substrate regions 1a are not largely deformed when the dividing groove 2 of one main surface and the dividing groove 3 of the opposite main surface are formed. This is because when the opening widths of the depths of the dividing groove 2 of one main surface and the dividing groove 3 of the opposite main surface are less than 0.01 mm, the force exerted on the bottom in the dividing groove 2 of one main surface or the dividing groove 3 of the opposite main surface decreases when the base substrate 1 is bent, and when the opening widths of the depths of the dividing groove 2 of one main surface and the dividing groove 3 of the opposite main surface are more than 1.0 mm, the area of one main surface or the opposite main surface of the wiring substrate 1e decreases. Further, when the opening width is smaller than 0.01 mm, the dividing grooves are easily closed or the depths of the dividing grooves decrease when the dividing groove 2 of one main surface or the dividing groove 3 of the opposite main surface are formed by pressing a cutter blade or a mold against the green body that becomes the base substrate 1 and the green body that becomes the base substrate 1 is fired.

Further, the distance L1 between the bottoms of the dividing grooves 2 of one main surface and the bottoms of the dividing grooves 3 of the opposite main surface is set smaller than the distance L2 between the bottoms of the dividing grooves 2 of one main surface and the opposite main surface or the distance L3 between the bottoms of the dividing grooves 3 of the opposite main surface and one main surface. When the distance L1 is 70% or less of the distance L2 and 70% or less of the distance L3, the division between the bottoms of the dividing grooves 2 of one main surface and the bottoms of the dividing grooves 3 of the opposite main surface becomes reliably easy.

Figure 3:
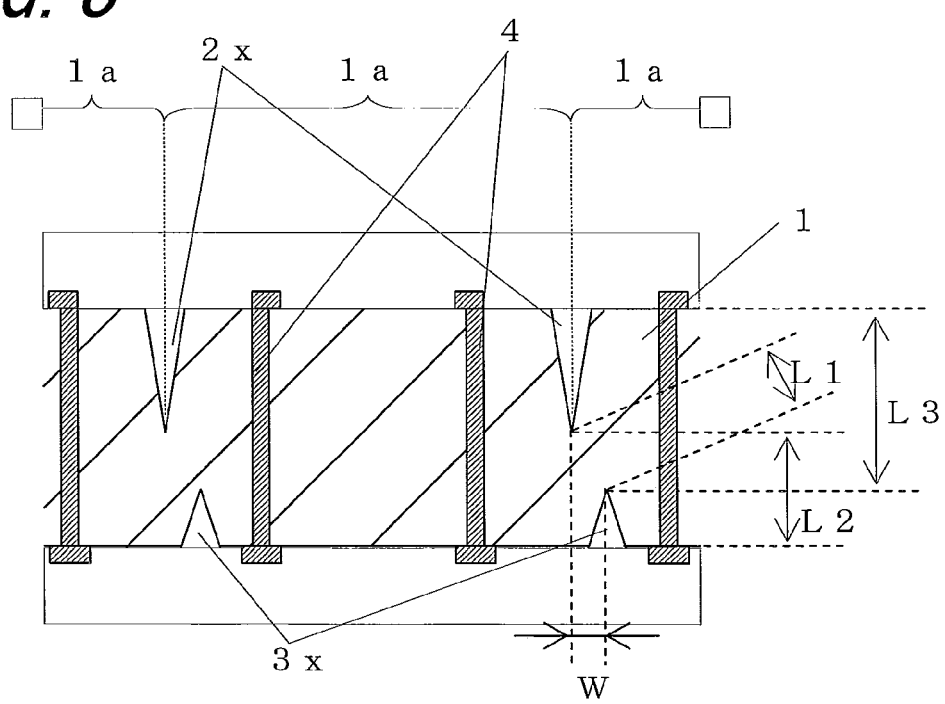
FIG. 3 is a cross-sectional view enlarging an A section of FIG. 1(b)

Further, when the gap W between the bottom of the dividing groove 2 of one main surface and the bottom of the dividing groove 3 of the opposite main surface of the example shown in FIG. 3 is 0.05 to 0.5 mm and the base substrate 1 is bent and divided, even if a burr is formed on the broken-out section 1d formed between the bottom of the dividing groove 2 of one main surface and the bottom of the dividing groove 3 of the opposite main surface, as described above, when the base substrate 1 is made of a sintered aluminum oxide, and when the transverse length of the burr is 20 to 30 μm, this is more effective to suppress two sides of a divided wiring substrate 1e from protruding to the outside further than the bottom of the dividing groove 2 of one main surface.

The aligning mark 5 may be formed by the same material and method as the wiring conductor 4, at one corner of each of the wiring substrate regions 1a. For example, the aligning mark may be formed by printing and applying a metallization paste for the aligning mark 5 to the ceramic green sheet for the base substrate 1 by using printing technique such as a screen printing method, and firing the metallization paste with the green body for the base substrate 1.

Further, metal with high corrosion resistance, such as nickel or gold, is applied to the exposed surface of the aligning mark 5, if necessary, similar to the wiring conductor 4. Therefore, it is possible to effectively suppress the aligning mark 5 from corroding and change the color of the wiring substrate 1e and the color of the aligning mark 5 to easily recognize the aligning mark 5, for example, when recognizing the directionality of the wiring substrate 1e with a camera.

The shape of the aligning mark 5 is not limited to a circle and preferably determined to easily recognize the directionality or position of the wiring substrate 1e, such as a polygon, a cross, or the shape of the character ku. Further, the aligning mark 5 may not be formed by metallization, but it may be possible to form a through-hole of a hole at one corner of each of the wiring substrate region 1a and use the through-hole or the hole as the aligning mark 5. When a through-hole or a hole is formed, a circular shape is preferable to suppress the through-hole or the hole from being damaged. Further, a conductor may be further formed at the bottom of the hole by metallization.

Further, as in the example shown in FIG. 4, the wiring substrate region 1a of one main surface of the base substrate 1 may have a recess 6 for receiving an electronic component while the dummy region 1b may have a dummy recess 7 disposed line-symmetrically to the recess 6, with the dividing groove 2 of one main surface as a symmetric axis. As the recess 6 is provided, an electric component can be received well in the recess 6, such that a wiring substrate 1e with high reliability can be achieved. Further, when the dummy recess 7 is formed, it is possible to uniformly distribute the stress exerted in the green body that becomes the base substrate 1 to the recess 6 and the dummy recess 7 and reduce deformation of the recess 6, when forming the dividing groove 2 of one main surface at the boundary of the wiring substrate region 1a and the dummy region 1b by pressing a cutter blade or a mold against the green body that becomes the base substrate 1.

The recess 6 and the dummy recess 7 may be formed by forming a through-hole for the recess 6 or the dummy recess 7 by a punching method using a mold or a punch with respect to some of the ceramic green sheets for the base substrate 1 and stacking the ceramic green sheet on a ceramic green sheet without a through-hole which becomes the bottom of the recess 6 and the dummy recess 7.

Further, by forming the dividing groove 2 of one main surface deeper than the recess 6 and making the distance L1 between the bottom of the dividing groove 2 of one main surface and the bottom of the dividing groove 3 of the opposite main surface smaller than the distance between the bottom of the dividing groove 2 of one main surface and the recess 6, it is possible to suppress generation of a crack toward the recess 6 from the bottom of the dividing groove 2 of one main surface when bending and dividing the base substrate 1 along the bottom of the dividing groove 2 of one main surface and the bottom of the dividing groove 3 of the opposite main surface.

Further, by positioning the groove 3 of the opposite main surface not to overlap the recess 6 when seen in a plan view and making the distance L1 between the bottom of the dividing groove 2 of one main surface and the dividing groove 3 of the opposite main surface smaller than the distance between the bottom of the dividing groove 3 of the opposite main surface and the recess 6, it is possible to suppress generation of a crack between the bottom of the recess 6 and the bottom of the dividing groove 3 of the opposite main surface.

Figure 5:
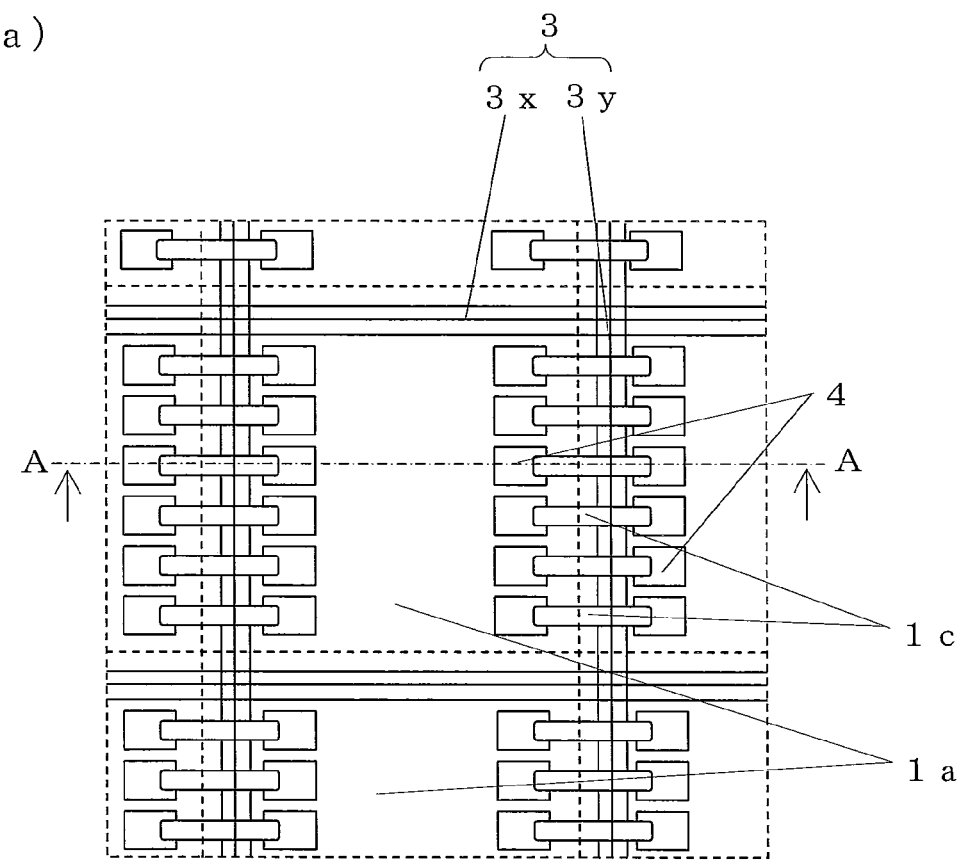
FIG. 5(a) is a partial enlarged bottom view showing another example of an embodiment of a many-up wiring substrate of the invention.
FIG. 5(b) is a cross-sectional view showing a cross-section taken along the line A-A of FIG. 5(a)
Figure 5:
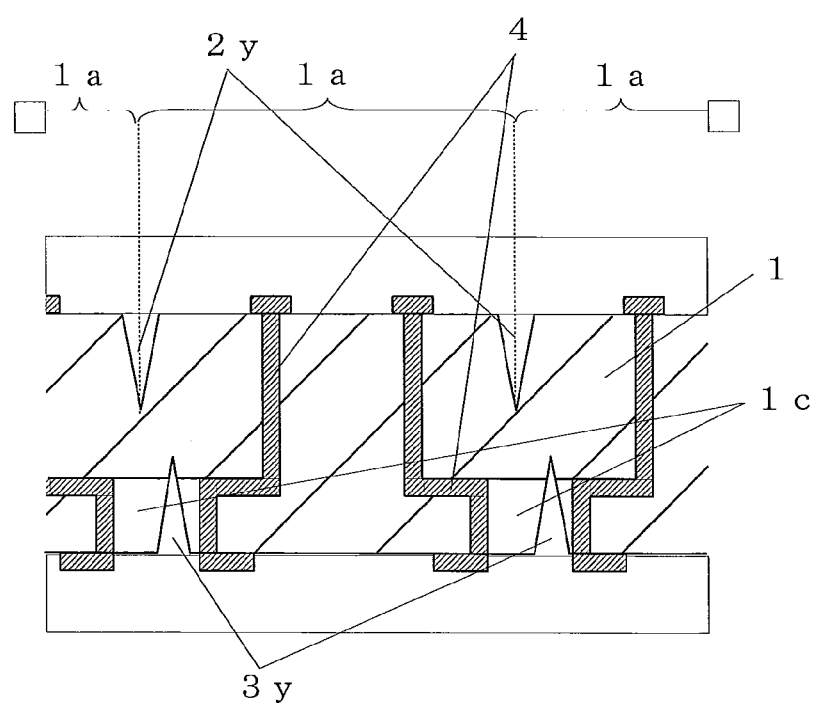

Further, as in the example shown in FIG. 5, a notch portion 1c where the wiring conductor 4 is formed on the inner surface may be formed between adjacent wiring conductors 4 with the dividing groove 3 of the opposite main surface interposed therebetween. When the base substrate 1 is divided, the notch portion 1c is divided, such that a groove where the wiring conductor 4 is formed on the inner surface of the side of the wiring substrate is formed, thereby achieving a so-called castellation conductor. Further, the notch portion 1c, for example, is formed in a rectangular or an elliptical shape of which the transverse direction becomes the long side when seen in a plan view such that the length of the transverse direction of the notch portion 1c is larger than the gap W between the dividing groove 2 of one main surface and the dividing groove 3 of the opposite main surface, thereby achieving a wiring substrate with a castellation conductor after the division.

Further, it is preferable to make the depth of the dividing groove 3 of the opposite main surface larger than the depth of the notch portion 1c, because stress easily concentrates not on the bottom of the notch portion 1c, but on the bottom of the dividing groove 3 of the opposite main surface, when the base substrate 1 is bent and divided along the dividing groove 2 of one main surface and the dividing groove 3 of the opposite main surface.

Figure 6:
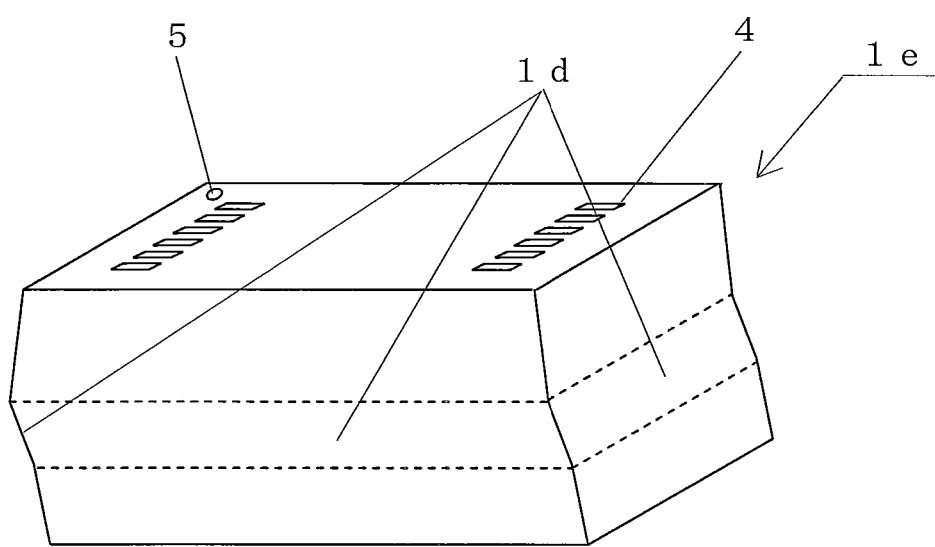
FIG. 6 is a perspective view showing an example of an embodiment of a wiring substrate obtained by dividing a many-up wiring substrate of the invention along dividing grooves.
Figure 7:
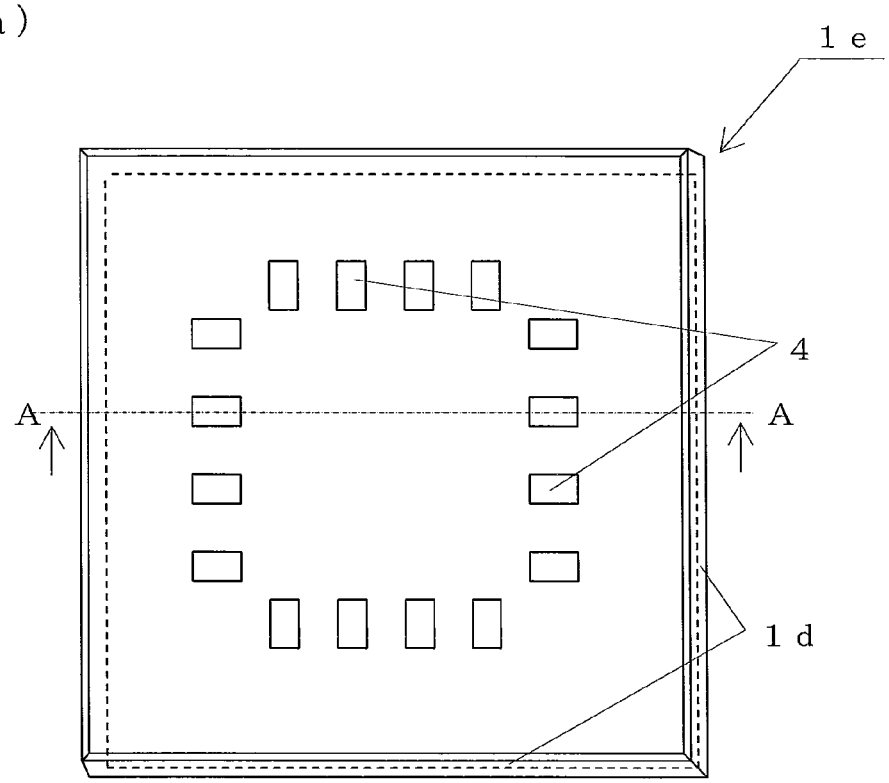
FIG. 7(a) is a plan view showing an example of an embodiment of a wiring substrate of the invention.
FIG. 7(b) is a cross-sectional view showing a cross-section taken along the line A-A of FIG. 7(a)
Figure 7:
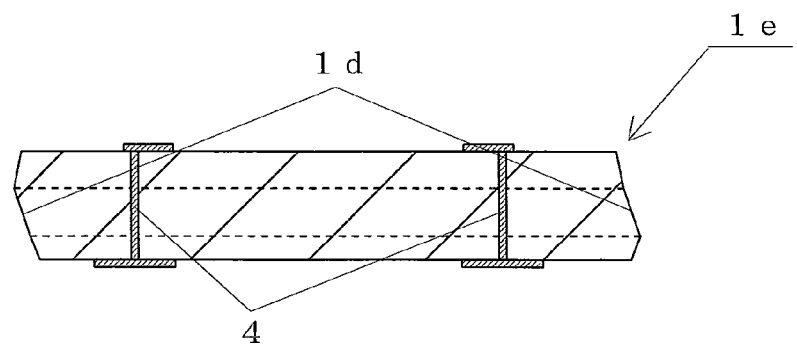
Figure 8:
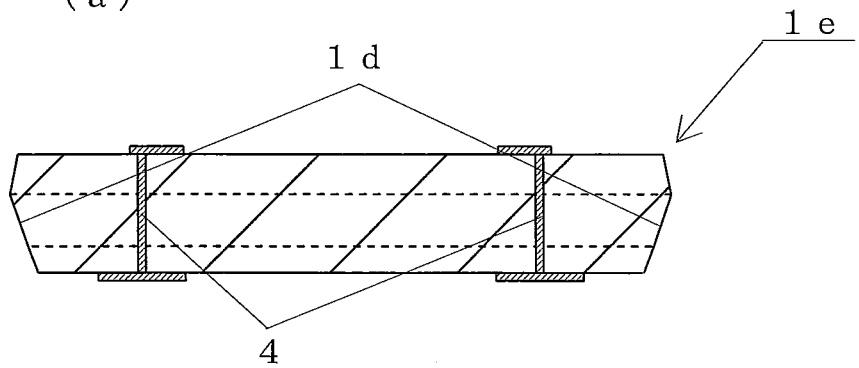
FIGS. 8(a) and 8(b) are cross-sectional views showing other examples of the embodiment of FIG. 7(b).
Figure 8:
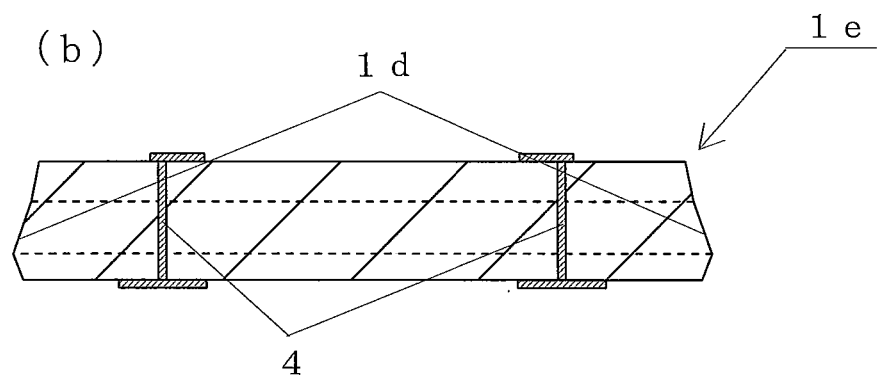

As the many-up wiring substrate having the configuration is divided along the dividing groove 2 of one main surface and the dividing groove 3 of the opposite main surface, a plurality of wiring substrates 1e each having a rectangular shape when seen in a plan view including two adjacent sides having broken-out sections 1d inclining with respect to the direction perpendicular to the main surface of the wiring substrate are obtained, as shown in FIGS. 6 to 8.

Since the wiring substrate 1e of the invention having a rectangular shape when seen in a plan view includes the two adjacent sides having the broken-out sections 1d inclined with respect to the direction perpendicular to the main surface of the wiring substrate, even if a burr is formed on the broken-out section 1d, it is possible to reduce protrusion of the burr outward further than an outer edge of the wiring substrate 1e in a plan view, such that it is possible to mount an electronic component precisely on the wiring substrate 1e, with the outer edge of the wiring substrate 1e as the reference for alignment of the wiring substrate 1e. For example, as in the example shown in FIG. 7(a), since the portion of the bottom of the dividing groove 2 of one main surface is the outer edge (left outer edge and upper outer edge of the wiring substrate 1e) at two adjacent sides of the wiring substrate 1e achieved by dividing the many-up substrate, the outer edge can be used as the reference for alignment. Further, in the outer edge of the example shown in FIG. 7(a), the portion that is the bottom of the dividing groove 2 of one main surface and the bottom of the dividing groove 3 of the opposite main surface may be the reference for alignment or the portion that is the bottom of the dividing groove 3 of the opposite main surface may be the reference for alignment.

When the portions that are the bottoms of the dividing grooves 2 of one main surface of two adjacent sides or the portions that are the bottoms of the dividing grooves 3 of the opposite main surface of two adjacent sides are used as the reference for aligning an electronic component, it is easy to focus on the outer edge of the wiring substrate 1e, because the outer edge of the wiring substrate 1e for alignment is at the same height in the thickness direction of the wiring substrate 1e when the wiring substrate 1e is aligned by image recognition. Therefore, it is possible to more precisely mount an electronic component on the wiring substrate 1e.

Further, when an electronic component-mounting region is provided on one main surface of the wiring substrate 1e, the electrode portion formed on one main surface of the wiring substrate 4 and the dividing groove 2 of one main surface are formed with the mark on one main surface as the reference. Therefore, the dividing groove 2 of one main surface is precisely disposed with respect to the electrode portion of one main surface, in comparison to the dividing groove 3 of the opposite main surface formed with the mark on the opposite main surface as the reference. Accordingly, when the portion that is the bottom of the dividing groove 2 of one main surface is used as a reference for aligning an electronic component, it is possible to reduce positional deviation when mounting an electronic component, as compared with when the bottom of the dividing groove 3 of the opposite main surface is used as the reference for alignment, such that it is possible to more precisely mount the electronic component on the wiring substrate 1e.

Further, in the wiring substrate 1e, as in the example shown in FIGS. 8(a) and 8(b), when all the broken-out sections 1d of four sides face one main surface or the opposite main surface of the wiring substrate 1e and incline with respect to the direction perpendicular to the main surface, the outer edge of the wiring substrate 1e when seen in a plan view is positioned at the same height in the thickness direction of the wiring substrate 1e. Therefore, it is easy to focus on any portion of the outer edge of the wiring substrate 1e when aligning the wiring substrate 1e by using image recognition. Accordingly, it is possible to more precisely mount an electronic component on the wiring substrate 1e. Further, as in the example shown in FIG. 8(a), when the broken-out sections 1d of four sides incline with respect to the direction perpendicular to the main surface, toward the opposite main surface of the wiring substrate 1e and an electronic component-mounting region is provided on one main surface side of the wiring substrate 1e, it is possible to enlarge the opposite main surface than one main surface. Accordingly, as in the example shown in FIG. 8(b), reducing the size of the wiring substrate 1e is effective, as compared with the case where the broken-out sections 1d of four sides incline with respect to the direction perpendicular to the main surface, toward one main surface of the wiring substrate 1e.

According to an electronic device of the invention, since an electronic component is mounted in the electronic component-mounting region of the wiring substrate 1e having the configuration described above, an electronic device with an electronic component precisely mounted in the electronic component-mounting region and two outer edges of the electronic device can be recognized well by an image recognizing device or the like, such that it is possible to precisely bond a cover or lens barrel to the electronic device with the outer edges of two sides of the electronic device as a reference, or mount the electronic device on an external electric circuit board.

The electronic component is a semiconductor device such as an IC chip or an LSI chip, or a piezoelectric element such as a crystal oscillator or a piezoelectric oscillator, and various sensors.

The electronic component is mounted, for example, when the electronic component is a flip chip type of semiconductor device, by electrically and mechanically connecting the electrode of the semiconductor device with the wiring conductor 4 with a bonding material such as a solder bump, a gold bump, or conductive resin (anisotropic conductive resin or the like). Further, an underfill may be injected between the electronic component and the wiring substrate 1e, after the electronic component is bonded to the electronic component-mounting region by the bonding material. Alternatively, for example, when the electronic component is a wire bonding type of semiconductor device, the electronic component is fixed to the electronic component-mounting region by a bonding material and then the electrode of the semiconductor device and the wiring conductor 4 are electrically connected by a bonding wire. Further, for example, when the electronic component is a piezoelectric element such as a crystal oscillator, the piezoelectric element is fixed and the electrode of the piezoelectric element and the wiring substrate 4 are electrically connected by a bonding material such as conductive resin. Further, if necessary, a second electronic component, such as a resistive element or a capacitive element, may be mounted around the electronic component. Further, when the recess 6 is formed, a second electronic component may be mounted in the recess 6 and then an electronic component may be mounted to cover the opening of the recess 6. In this case, it is possible to reduce the size of the electronic device when seen in a plan view, as compared with when an electronic component and a second electronic component are mounted on the same plane.

Further, the electronic component are sealed by a cover or resin, if necessary. The cover is a cap made of metal, ceramics, glass, or resin. It is preferable to have a coefficient of thermal expansion close to the coefficient of thermal expansion of the insulating base of the wiring substrate 1e, and for example, when the insulating base is made of a sintered aluminum oxide and a cover made of metal is used, it is preferable to use an Fe—Ni (iron-nickel) alloy or a Fe—Ni—Co (iron-nickel-cobalt) alloy. When the electronic component is a solid-state imaging device or a light emitting element, not only the cover is implemented by a transparent plate made of glass or resin, but a transparent lens made of glass or resin or a cover where a lens is mounted may be used.

Further, when being sealed by resin, the electronic component may be coated with resin such as epoxy resin or silicone resin. Further, when the electronic component is a light emitting element, the light emitting element may be coated with resin containing fluorescent substances and the wavelength of light emitted from the light emitting element may be changed by the fluorescent substances in the coating resin.

Further, the invention may be modified in various ways without departing from the spirit of the invention. For example, the recess 6 may be formed on both main surfaces of the base substrate 1.

EXAMPLES

Next, a detailed example of the many-up wiring substrate of the invention is described.

A many-up wiring substrate was prepared in which, wiring substrate regions 1a of 8.20 mm×8.80 mm were arranged in longitudinally eight rows and transversely seven columns on a base substrate 1 made of a sintered aluminum oxide with a length of 85 mm, a width of 68 mm, and a thickness of 1.0 mm, and, in an outer periphery of the base substrate 1, rectangular dummy regions 1b with a width 9.7 mm and a width 3.2 mm were disposed above and below and left and right, respectively.

Dividing grooves 2 with a depth of 0.5 mm were formed on one main surface and dividing grooves 3 with a depth of 0.2 mm were formed on the opposite main surface, in the many-up wiring substrates of Examples 1 to 3 of the invention and Comparative Example.

In Example 1, the gap W between the bottom of the dividing groove 2 of one main surface and the bottom of the dividing groove 3 of the opposite main surface was set at 50 µm (L1 was 0.3 mm, L2 was 0.5 mm, and L3 was 0.8 mm), when seen in a plan view.

Next, in Example 2, the gap W between the bottom of the dividing groove 2 of one main surface and the bottom of the dividing groove 3 of the opposite main surface was set at 100 µm (L1 was 0.32 mm, L2 was 0.5 mm, and L3 was 0.8 mm), when seen in a plan view.

Further, in Example 3, the gap W between the bottom of the dividing groove 2 of one main surface and the bottom of the dividing groove 3 of the opposite main surface was set at 0.2 mm (L1 was 0.36 mm, L2 was 0.5 mm, and L3 was 0.8 mm), when seen in a plan view.

Further, in Comparative Example, the gap W between the bottom of the dividing groove 2 of one main surface and the bottom of the dividing groove 3 of the opposite main surface was set at 0 mm (L1=0.3 mm, L2=0.5 mm, and L3=0.8 mm) in a plan view, that is, the gap W between the bottom of the dividing groove 2 of one main surface and the bottom of the dividing groove 3 of the opposite main surface overlapped each other in a plan view.

Further, fifty-six wiring substrates were respectively achieved by dividing the many-up wiring substrates of Examples 1 to 3 and Comparative Example along the dividing grooves on one main surface and the dividing grooves on the opposite main surface. Thereafter, whether there is a burr protruding outside further than the bottoms of the driving grooves of one main surface and whether there is a burr on the broken-out sections 1d were observed by a microscope, for the wiring substrates.

As a result, in the wiring substrates 1e obtained by dividing the many-up wiring substrates of Examples 1 to 3, it could be seen that burrs protruding about 10 to 30 μm further than the broken-out sections 1d were two of fifty six, five of fifty six, three of fifty six, in Example 1, in Example 2, and in Example 3, respectively, but there was no burr protruding outward further than the bottoms of the dividing grooves 2 of one main surface when seen in a plan view in any of Examples 1 to 3. Further, in Comparative Example, it could be seen that there were burrs protruding about 10 to 30 μm further than the bottoms of the dividing grooves 2 of one main surface, in three of fifty six. Accordingly, the ratio of the wiring substrates with protruding burr was 5.3% in Comparative Example, whereas the ratio of the wiring substrates 1e with protruding burrs was 0% in Examples 1 to 3 of the invention, such that it was possible to suppress protrusion of burrs from the wiring substrate, as compared to the related art.

It could be seen from the result that according to the many-up wiring substrate of the invention, when seen in a plan view, the dividing grooves 2 of one main surface and the dividing grooves 3 of the opposite main surface are formed to be deviated in the longitudinal direction or the transverse direction, the distance L1 between the bottoms of the dividing grooves 2 of one main surface and the bottoms of the dividing grooves 3 of the opposite main surface is smaller than the distance L2 between the bottoms of the dividing grooves 2 of one main surface and the opposite main surface and the distance L3 between the bottoms of the dividing grooves 3 of the opposite main surface and one main surface, such that when the base substrate 1 is bent and divided along the dividing groove, the portions between the bottoms of the dividing grooves 2 of one main surface and the bottoms of the dividing grooves 3 of the opposite main surface are divided, and the broken-out sections 1d between bottoms of the dividing grooves 2 of one main surface and the bottoms of the dividing grooves 3 of the opposite main surface are inclined at the sides of the wiring substrates 1e, such that when one main surface is the mounting surface of the wiring substrates 1e, even if a burr is formed on the broken-out surfaces 1d facing the opposite main surface, it was confirmed that it is possible to reduce protrusion of the burr outward further than the bottom of the dividing grooves 2 of one main surface.

REFERENCE SIGNS LIST

1: Base substrate
1a: Wiring substrate region
1b: Dummy region
1c: Notch portion
1d: Broken-out section
1e: Wiring substrate
2: Dividing groove of one main surface
3: Dividing groove of opposite main surface
4: Wiring conductor
5: Aligning mark
6: Recess
7: Dummy recess

The invention claimed is:

1. A many-up wiring substrate, comprising:
a base substrate of insulating ceramic material having dividing grooves formed as part of main surfaces thereof, along all boundaries of a plurality of wiring substrate regions, the plurality of wiring substrate regions being arranged in a matrix and each having an electronic component-mounting region at a center thereof,
when seen in a transparent plan view, dividing grooves of one main surface comprising transverse dividing grooves and longitudinal dividing grooves and dividing grooves of an opposite main surface comprising transverse dividing grooves and longitudinal dividing grooves, the dividing grooves of the one main surface and the dividing grooves of the opposite main surface being formed to be deviated in one direction with respect to each of a transverse direction and a longitudinal direction, and
a distance between bottoms of the dividing grooves of the one main surface and bottoms of the dividing grooves of the opposite main surface being smaller than a distance between the bottoms of the dividing grooves of the one main surface and the opposite main surface and a distance between the bottoms of the dividing grooves of the opposite main surface and the one main surface.

2. The many-up wiring substrate according to claim 1, wherein an aligning mark is disposed at one corner of each of the wiring substrate regions.

3. The many-up wiring substrate according to claim 1, wherein when seen in a transparent plan view, the dividing grooves of the one main surface and the dividing grooves of the opposite main surface are formed to be deviated in one direction so as to be alternating with each other in each of the transverse direction and the longitudinal direction.

4. The many-up wiring substrate according to claim 1, wherein a sum of the dividing groove of the one main surface and the dividing groove of the opposite main surface are 50% to 70% of a thickness of the base substrate.

5. A wiring substrate, comprising:
a substrate of insulating ceramic material having a rectangular shape when seen in a plan view,
four side surfaces of the substrate each having a broken-out section inclining with respect to a direction perpendicular to a main surface of the substrate, and the broken-out section being disposed at a position away from one main surface and an opposite main surface of the substrate, and all of the four broken-out sections facing one of the one main surface and the opposite main surface of the substrate.

6. An electronic device, comprising:
the wiring substrate according to claim 5; and
an electronic component mounted on the wiring substrate.

7. A wiring substrate, comprising:
a substrate of insulating ceramic material, including two main surfaces having a rectangular shape when seen in a plan view, each of the main surfaces being delimited by edges, four side surfaces of the substrate between edges of one main surface and edges of the other main surface each having two surface sections coming from walls of former dividing grooves and reaching from each of the edges to the bottom of the respective former dividing groove, and having a broken-out section inclined with respect to a direction perpendicular to the main surfaces of the substrate, wherein the broken-out section is disposed between the bottom of the respective former dividing grooves, and all of the four broken-out sections facing one of the one main surface and the opposite main surface of the substrate.

* * * * *